United States Patent [19]

Malaviya

[11] Patent Number: 4,648,173
[45] Date of Patent: Mar. 10, 1987

[54] FABRICATION OF STUD-DEFINED INTEGRATED CIRCUIT STRUCTURE

[75] Inventor: Shashi D. Malaviya, Hopewell Junction, N.Y.

[73] Assignee: International Business Machines Corporation, Armonk, N.Y.

[21] Appl. No.: 737,745

[22] Filed: May 28, 1985

[51] Int. Cl.[4] .................. H07L 21/20; H07L 21/28
[52] U.S. Cl. ........................... 29/576 W; 29/571; 29/576 B; 29/576 E; 148/1.5; 148/175; 148/187; 357/50
[58] Field of Search ............... 29/571, 576 B, 576 W, 29/576 E; 148/1.5, 175, 187; 357/50

[56] References Cited

U.S. PATENT DOCUMENTS

| | | | |
|---|---|---|---|
| 3,648,125 | 3/1972 | Peltzer | 317/235 |
| 4,095,330 | 6/1978 | Kim | 29/580 |
| 4,104,086 | 8/1978 | Bondur et al. | 148/1.5 |
| 4,104,090 | 8/1978 | Pogge | 148/175 |
| 4,211,582 | 7/1980 | Horng et al. | 29/576 W |
| 4,400,865 | 8/1983 | Goth et al. | 29/571 |
| 4,430,791 | 2/1984 | Dockerty | 29/571 |
| 4,444,605 | 4/1984 | Slawinski | 148/187 |
| 4,502,913 | 3/1985 | Lechaton et al. | 156/643 |
| 4,508,579 | 4/1985 | Goth et al. | 148/175 |
| 4,510,016 | 4/1985 | Chi et al. | 29/643 |
| 4,549,927 | 10/1985 | Goth et al. | 29/576 W |
| 4,561,932 | 12/1985 | Gris et al. | 29/576 W |
| 4,572,765 | 2/1986 | Berry | 156/643 |

OTHER PUBLICATIONS

S. D. Malaviya, "High Speed Bipolar Process", IBM Technical Disclosure Bulletin vol. 27, No. 7B, Dec. 1984, pp. 4510–4514.
S. D. Malaviya, "Metal Lift–Off Process for Submicron Spacings", IBM Technical Disclosure Bulletin, vol. 26, No. 3A, Aug. 1983, pp. 1063–1065.

Primary Examiner—Upendra Roy
Attorney, Agent, or Firm—T. Rao Coca

[57] ABSTRACT

Fabrication of a submicron wide single crystal silicon structure protruding from a monolithic silicon body. Starting with a single crystal N silicon body having a P region, an insulator stud of submicron width and length dictated by the limits of lithography is formed on the P region. Using the stud as a mask, the P region is etched forming the top narrow portion having the stud width projecting from the silicon body. On the exposed sides of the top portion oxide walls are formed and the etching continued forming the middle portion of a width exceeding that of the top portion. An oxide-nitride wall is established on the exposed sides of the middle portion and, using the resulting structure as a mask, the etching is continued to completely etch through the P region and a substantial portion of the underlying N silicon body thereby forming a free-standing silicon protrusion structure. Thick oxide walls are formed on the just exposed sides of the silicon. Alternatively, the exposed sides of silicon may be completely oxidized to obtain a fully dielectrically isolated silicon protruding structure.

To form NPN device from the silicon protrusion structure, the oxide-nitride walls corresponding to the middle portion are removed and N-type dopant is introduced from the thus exposed sides forming the emitter and collector juxtaposed on either side of the central P-type region which functions as the base. Self-aligned metal contacts to the elements of the transistor are established on the top and sides.

27 Claims, 14 Drawing Figures

FABRICATION OF STUD-DEFINED INTEGRATED CIRCUIT STRUCTURE

FIELD OF THE INVENTION

The invention relates to a highly dense integrated circuit structure including free-standing semiconductor pedestal devices within the integrated circuit and methods for making this structure. The device structures are fabricated in a semiconductor material in a self-aligned manner and include active devices such as bipolar transistors, field effect transistors, Schottky barrier diodes and passive devices such as resistors and capacitors.

CROSS REFERENCE TO RELATED APPLICATIONS (1) Patent application Ser. No. 674,439 filed Nov. 11, 1984 entitled "Lateral Device Structures Using Self-Aligned Fabrication Techniques".

(2) Patent application Ser. No. 393,932 filed June 30, 1982 entitled "Total Dielectric Isolation for Integrated Circuits".

BACKGROUND OF THE INVENTION

The hallmark of progress in semiconductor integrated circuit technology in the past decade has been improvements in such integrated circuit features as density, speed and performance. This has been made possible, in part, due to improvements in semiconductor processing techniques such as new lithography (optical and non-optical) methods capable of submicrometer exposures, replacement of wet etching by dry methods—plasma etching, reactive ion etching (RIE) and ion beam milling—to bypass the deficiencies of wet etching, use of low resistivity silicides and refractory metals as replacements for high-resistivity polysilicon interconnections and multiple photoresists to compensate for wafer surface variations that thwart accurate fine-line lithography.

The main driving force behind this progress has been the advantages of scaling, i.e. reducing, the device dimensions since scaling is directly linked to reduced fabrication cost and improved performance. Scaling down boosts circuit density by the square of the scale factor (which is defined as the ratio of the original dimension to the reduced dimension). The end result of this is more elements per chip area and more devices per wafer, the latter cutting the cost of manufacture. Scaling also reduces a circuit's operating power, capacitance, and delay times since these parameters are dependent on the dimensions of the circuit.

Despite this impressive progress, the prior art imposes an inherent limitation on device density due to the requirement that the various active and passive devices of the integrated circuit be dielectrically isolated from one another and such isolation consumes valuable chip real estate. To elaborate on this, reference is made to two most commonly used dielectric isolation schemes, the recessed oxide isolation (ROI) and the polyimide- or polysilicon-filled trench isolation (PIT). FIG. 1 shows a prior art widely used ROI for a vertical NPN bipolar device and can be better understood by reference to the Peltzer U.S. Pat. No. 3,648,125 and I. Magdo, et al. patent application Ser. No. 150,609, filed June 7, 1971. In FIG. 1 the base region 12 contains the emitter region 14. A N+ reach-through region 16 contacts the N+ subcollector region 18 which is located on the P− substrate 10. The base, emitter and collector contact electrodes are designated, respectively, by B, E and C. The ROI regions 20 dielectrically isolate surface regions of substrate 10 containing the bipolar transistors. Provided underneath each ROI region 20 is a P+ isolation region 22 to prevent an electrical short between N+ regions 18 of one transistor and the next caused by the downward segregation, during the thermal growth of the ROI regions, of the N-type epitaxial regions directly underneath the ROI regions 20. However, since the region 22 has a high concentration of P-type dopant, it needs to be spaced from the subcollector regions 18 having a high concentration of N-type dopant, otherwise the PN junctions formed between the regions 18 and 22 may cause dislocations leading to leakage of the bipolar devices. Also, since the regions 22 is relatively deep and encircles the subcollector 18, the junction capacitance between these regions tends to build up to a high level rendering the transistor slow.

Typically, the width of the P+ isolation region 22 is about 2.5 $\mu$m. The spacing between the subcollector 18 and the isolation region 22 is dictated by the particular application of the transistor. For example, for memory application this spacing is about 2 $\mu$m and for high speed logic applications it is about 5 $\mu$m. In other words, a prior art transistor which is dielectrically isolated by ROI requires a collector-to-collector spacing of about 6.5 $\mu$m or 12.5 $\mu$m depending on whether it is intended for memory or high speed logic applications, respectively.

To overcome the above problems associated with ROI, trench isolation, shown in FIG. 2, has been devised. This prior art dielectric isolation can be better understood by reference to the Pogge U.S. Pat. No. 4,104,090 and Bondur et al. U.S. Pat. No. 4,104,086 both assigned to the assignee of the present application. In FIG. 2 the various elements designated by primed numbers correspond to their counterpart elements in FIG. 1 designated by numbers without the prime. In the trench isolation scheme, the ROI 20 of FIG. 1 is substituted with a rather deep polysilicon- or polyimide-filled trench 20'. Since the P+ isolation 22' is spaced sufficiently far away from the N+ subcollector 18', the problem of a high junction capacitance between these highly doped regions, which exists in the ROI scheme, is absent in trench isolation. Another advantage of the trench isolation is that the width of the trench, regardless of whether it is filled with polysilicon or polyimide and regardless of whether the transistor is intended for memory or high speed logic applications, is small (typically 1.5 $\mu$m) compared with that of the ROI.

However, trench isolation requires a complex series of process steps to insure against troublesome creepage of dislocations or injection of charges from the sides of the trench thereby rendering the trench ineffective. Also, despite the significantly reduced width of the trench isolation compared to that of ROI, to fabricate very high density and performance circuits of the future the demands placed on the chip real estate by this isolation scheme is still rather high.

In addition to the stringent demands placed on the valuable chip real estate by the prior art isolation schemes, the prior art bipolar devices require all contacts to the various elements of the device be made on the top surface of the monolithic silicon. Since the contacts are photolithographically defined, the silicon real estate occupied by these contacts cannot be reduced beyond a certain limit. To elaborate on this, reference is made to FIG. 3 which is a top view of the bipolar device illustrated in FIGS. 1 and 2 without the encircling dielectric isolation. As illustrated in FIG. 3, the contacts B, C and E require an approximately common width W2 and lengths L2, L4 and L6, respectively. Also, the contacts need to be spaced from each other or the dielectric isolation by the indicated spacings of L1, L3, L5, L7, W1 or W3. Consequently, silicon area occupied by the transistor has a dimension in one direction of L1+L2+L3+L4+L5+L6+L7 and a dimension in the perpendicular direction of W1+W2+W3. Even if it were possible to reduce these dimensions to the smallest spacing A that can be achieved by conventional photolithography, the area occupied by the transistor will be as much as 7A×3A. In other words, any area reduction that can be attained in the prior art transistors is constrained by the lithography limits.

Accordingly, it is an object of the invention to provide an integrated circuit having an increased device density, by reducing the silicon area occupied by the device structures.

It is another object of the invention to provide integrated circuit devices having an improved performance resulting from reduction in the device size and associated parasitic capacitances.

It is another object of the invention to eliminate the dielectric isolation between one integrated circuit device and the next.

Another object of the invention is to provide a process of forming the above integrated circuit by means of a significantly reduced number of masking steps compared to the prior art processes.

SUMMARY OF THE INVENTION

The above objects and other related objects and advantages may be achieved by means of a submicron-wide and elongated, doped single crystal silicon structure which protrudes from a monolithic silicon body. The single crystal structure, which is of a three-dimensional configuration, includes a lower section of a first conductivity type and an upper section of a second conductivity type, the two width-determining sides of these sections being covered with insulative material(s). The upper section consists of narrow top and bottom portions and a middle portion of a greater width than the top and bottom portions. Alternatively, the lower section and the bottom portion of the upper section of the protrusion structure are formed of an insulating material resulting in a total dielectrically isolated silicon protrusion structure.

The desired high performance semiconductor device, including a lateral PNP or NPN bipolar transistor, field effect transistor, high/low barrier height Schottky barrier diode, and resistor, is formed in the three-dimensional protruding silicon structure. For example, in case of an NPN transistor, the central region in the middle portion of the protruding structure constitutes the base region, the emitter and collector being embedded in two outer side regions thereof in a mutually facing relationship for efficient carrier injection from the emitter to the collector via the base therebetween. Electrical contacts to the various elements of the device are established on the top and/or sides of the three-dimensional structure. Since the device protrudes from the silicon body, it is essentially self-isolated requiring no area-consuming dielectric isolation. This improvement coupled with the fact that each device occupies only a submicron-wide portion of the silicon, provides a significant reduction in silicon real estate requirement of a device thereby rendering the resulting integrated circuit extremely dense.

The method of fabricating the three-dimensional structure protruding from a monolithic silicon body is described. A single crystal silicon body of a first conductivity type (hereafter referred to, for brevity, as N-type) having a region of a second conductivity type (hereafter referred to as P-type) on a surface portion thereof is provided. By conventional sidewall image transfer technique, a submicron wide insulator stud is formed on the silicon body over the P-type region. Using the stud as a mask, the top portion of the P-type region is reactively ion etched forming a corresponding submicron-wide P-type silicon protruding from the remainder of the body. Then a thick oxide wall is established on the sides of the stud and the protrusion. Using this thick oxide-flanked structure as a mask, the middle portion of the P-type silicon is further etched forming a protruding structure consisting of a wide P-type silicon bottom portion having bare walls and a narrow P-type silicon top portion covered with the stud-oxide cap. Then an oxide-nitride dual mask is formed on the bare walls of the P-type silicon and on the oxide sidewalls. The etching process is continued to completely etch through the remaining P-type silicon and a portion of the N-type single crystal silicon thereunder. The resulting structure consists of a fully exposed, wide bottom portion comprised successively of N-type silicon and P-type silicon, a middle portion of an intermediate width and a top portion of narrow width of P-type silicon, the sides of the intermediate and top portions being masked by oxide-nitride and (thick) oxide-nitride masks, respectively, and the roof of the top portion being the insulator stud. Next, the nitride is removed from everywhere except in the regions of the silicon protruding structure where the emitter and collector will be formed. Thereafter, by thermal oxidation, a thick sidewall of oxide is formed in selected regions on the exposed wide bottom portion of the silicon structure while simultaneously forming a thick oxide layer on the remainder of the exposed N-type silicon body. Alternatively, this thermal oxidation is continued until the silicon of the bottom is fully converted to oxide resulting in a total dielectrically isolated silicon structure protruding from the silicon body.

The protruding structure formed in this manner can be used for fabricating therefrom a variety of active or passive devices. To fabricate a lateral NPN transistor, for example, the nitride-oxide mask corresponding to the intermediate-width P-type silicon portion is removed and N-type dopant is introduced from the thus exposed two sides forming the emitter and collector separated by the central P-type region which serves as the base of the transistor. Contact metallurgy is then formed on either side of the protruding structure establishing self-aligned contacts with the emitter and the collector. The insulator stud is then etched off to expose the base contact followed by forming base contact metallurgy. Alternatively, the insulator stud may be first etched off, followed by formation of emitter, base and collector contact metallurgy.

BRIEF DESCRIPTION OF THE DRAWINGS

The novel features, elements and process steps characteristic of the invention are set forth in the appended claims. The invention itself, however, will be best understood by reference to the detailed description which follows in conjunction with the accompanying drawings, wherein:

DETAILED DESCRIPTION OF THE PREFERRED EMBODIMENT

Figure 1:
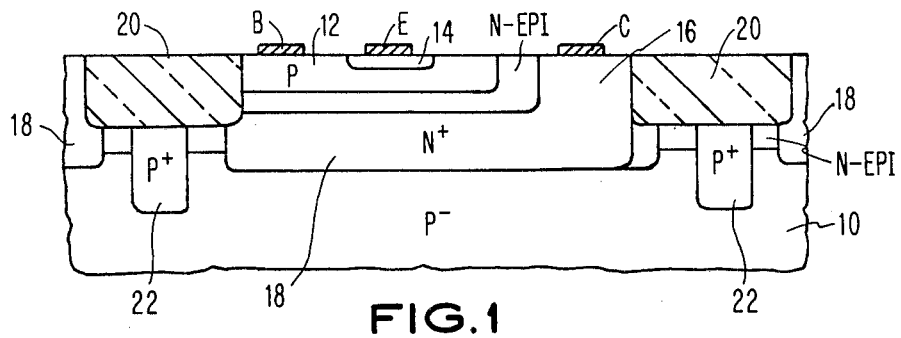
FIGS. 1 and 2 schematically illustrate in a cross-sectional representation known prior art dielectrically isolated bipolar transistor structures.
Figure 2:
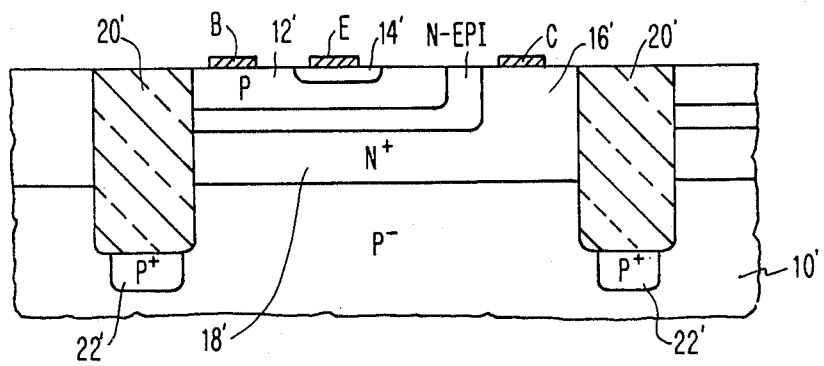
Figure 3:
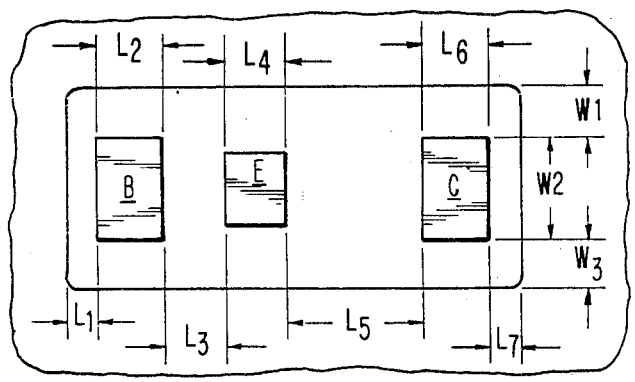
FIG. 3 is a schematic top view representation of the prior art structures of FIGS. 1 and 2 showing the area occupied by the metallization contacts to the various elements of the transistor.

Referring now more particularly to FIGS. 4-10, the successive manufacturing steps for the fabrication of a free-standing three-dimensional semiconductor structure protruding from a semiconductor body are shown. The structure of FIG. 4 includes the monocrystalline silicon substrate 30 which is shown as P-type conductivity for illustration purposes. The substrate 30 can also by N-type. The substrate 30 is typically <100> crystallographic oriented silicon having a resistance in the order of 10-20 Ohms-cm. The substrate 30 has grown on top thereof an epitaxial N layer 32. The epitaxial growth process to form layer 32 may be done by conventional techniques, such as the use of silicon tetrachloride/hydrogen or silane/hydrogen mixture at temperatures in the range of 1,000°-1,150° C. The thickness of the layer 32 for highly dense integrated circuits is of the order of 1-3 $\mu$m. The epi layer 32 is then oxidized to form layer 34, typically about 500-1,000 A thick upon its surface.

It should be noted that the thickness and other dimensions shown in the drawings are selected for clarity of illustration and not to be interpreted in a limiting sense. Also, the various etching steps that will be utilized throughout the present fabrication process insofar as they are conventional, will not be described. It is well known that silicon nitride material is dry etched by reactive ion etching (RIE) using $CF_4$, etc. and wet etched by using hot phosphoric acid. Polysilicon is etched by RIE, for example, using a mixture of $SF_6$ and $Cl_2$ and wet etched by means of either $HF/Cr_2O_3$ or pyrocatechol. Silicon dioxide is etched by RIE using $CF_4$, etc. and wet etched with buffered HF.

Next, the P region 36 is formed in a surface portion of the epitaxial layer 32. Region 36 will serve as the active region in which the final semiconductor device will be formed. For example, if the final intended device is a bipolar transistor or a field effect transistor, the base-emitter-collector or source-drain-gate, as the case may be, are formed in region 36. The P region 36 may be formed by deep ion implantation using, for example, boron ions of a suitable energy and dose followed by thermal drive-in to obtain a uniform or non-uniform dopant concentration therein. For example, if the final intended structure is a NPN transistor, non-uniform or graded dopant concentration is provided in region 36 consisting of a high dopant concentration (e.g., about $5 \times 10^{18}$ atoms/cc) at the bottom thereof and a low dopant concentration (e.g., $2 \times 10^{16}$ atoms/cc) at the top thereof. As will become more apparent subsequently, this dopant gradient will serve as an effective barrier to electrons and serve to increase the emitter efficiency and thereby the transistor gain.

Figure 4:
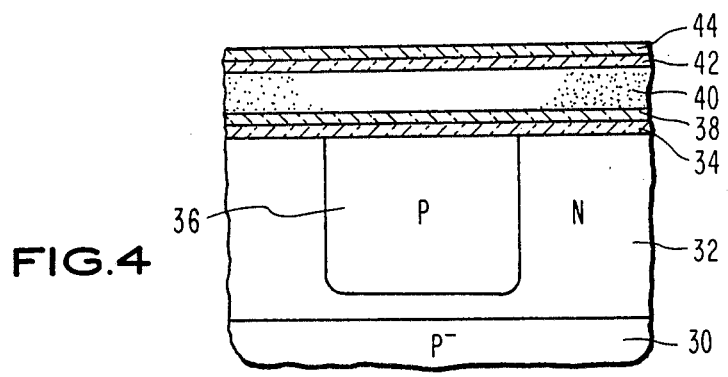
FIGS. 4-10 schematically illustrate in a cross-sectional representation the views at the various stages of one fabrication process embodiment employed to make a three-dimensional semiconductor structure in accordance with the principles of the present invention.

Referring to FIG. 4, the next series of process steps involves formation on the oxide 34, by blanket deposition, for example, of the successive layers of the silicon nitride 38, polysilicon 40, silicon nitride 42 and silicon dioxide 44. The approximate thickness range of each of the nitride layers 38 and 42 is 500-1,000 A; that of polysilicon 40 is 0.5-1.5 $\mu$m; and that of oxide 44 is 500-1,000 A. It should be noted that the thickness of the polysilicon 40 is dictated by the thickness of the oxide stud that will be subsequently formed in a juxtaposed relationship with a portion of polysilicon 40 as will be made apparent hereinbelow.

Figure 5:
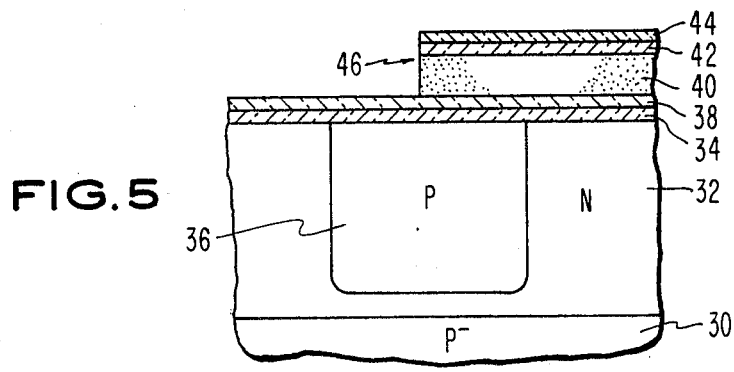
Figure 6:
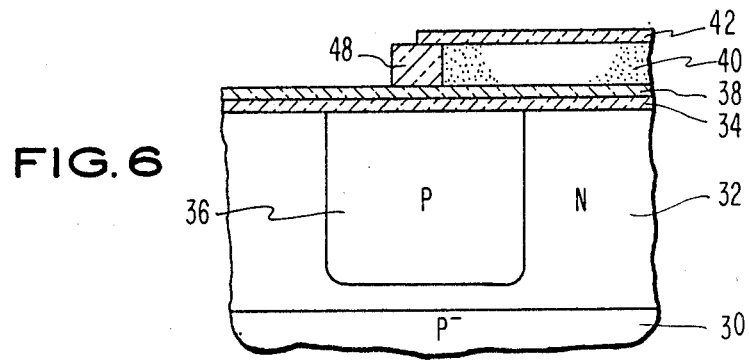

Next, by conventional photolithography and etching techniques the oxide layer 44 is patterned as illustrated in FIG. 5 so that the edge 46 of the layer 44 approximately corresponds to the center of the P region 36. Using the oxide 44 patterned in this manner as a mask, the underlying nitride 42 and the polysilicon 40 are etched, for example, by reactive ion etching using appropriate reactive etch species resulting in a sharp vertical polysilicon wall in correspondence with the oxide edge 46. Detection of the end point of these etch steps is conveniently facilitated by the nitride 38. The remaining top oxide layer 44 is then removed, for example, by using wet etch and the resulting structure is subjected to a thermal oxidation process step to grow a thick oxide stud 48 (FIG. 6) on the exposed wall of the polysilicon. During this oxidation step a portion of the exposed polysilicon is consumed and the oxide stud 48 projects beyond the nitride mask 42 as illustrated in FIG. 6. The degree to which the stud 48 projects outward can be controlled by appropriately recessing the exposed polysilicon wall utilizing a wet etch prior to the thermal oxidation. The width of the stud is governed by the width of the ultimate desired device. Typically, the width of stud 48 is in the range of 0.5-1.5 $\mu$m, the preferred width for fabricating submicron-wide devices being about 0.8 $\mu$m.

Thereafter, the top nitride layer 42 and the exposed part of nitride 38 are removed by RIE. The polysilicon 40 exposed as a consequence of the previous step is then removed, for example, with pyrocatechol leaving the oxide stud isolated and freestanding. The oxide stud 48 formed in this manner will serve as an effective submicron mask during the ensuing series of etching steps to form the submicron silicon protrusion structure.

By forming a planarizing layer of baked photoresist followed by photolithography, unwanted portions of the stud are removed using RIE to obtain a stud of the desired length. For further details of the stud forming process reference is made to the article entitled "High Speed Bipolar Process" by S. D. Malaviya, IBM Technical Disclosure Bulletin, Vol. 27, No. 7B, pp. 4510-4514, December 1984 and U.S. Pat. No. 4,430,791 issued to R. C. Dockerty and assigned to the present assignee.

Figure 7:
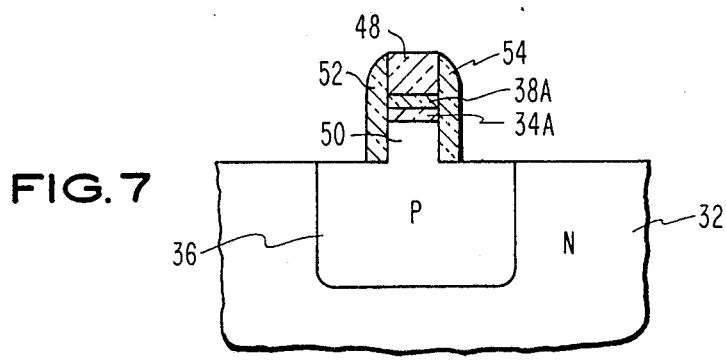

Turning to FIG. 7 now, the process is continued to first remove, for example, by blanket RIE, the portions of the nitride 38 and oxide 34 not masked by the oxide stud 48 followed by removal of an upper surface layer of the P-type single crystal silicon epitaxial material. The thickness of the single crystal material etched off is typically in the range of 0.25–0.5 $\mu$m. The structure resulting from these etching steps is as illustrated in FIG. 7. It consists of a submicron-wide P-type single crystal silicon protrusion 50 having perched atop thereof remnants 34A and 38A of oxide 34 and nitride 38, respectively, and oxide stud 48.

Continuing with reference to FIG. 7, next a short thermal oxidation step is accomplished to form a thin oxide layer (not shown) on the exposed silicon substrate followed by chemical vapor deposition (CVD) of a relatively thick (typically, 0.2–0.4 $\mu$m thickness) oxide over the entire structure. The thin thermal oxide is necessary to prevent formation of the generally regarded "dirty" CVD oxide directly on the single crystal silicon which would contaminate the silicon. Then, by RIE, the oxide over the substantially horizontal surfaces is removed leaving substantial vertical sidewalls of oxide 52 and 54 on either side of the structure designated by the numeral combination 50-34A-38A-48.

Figure 8:
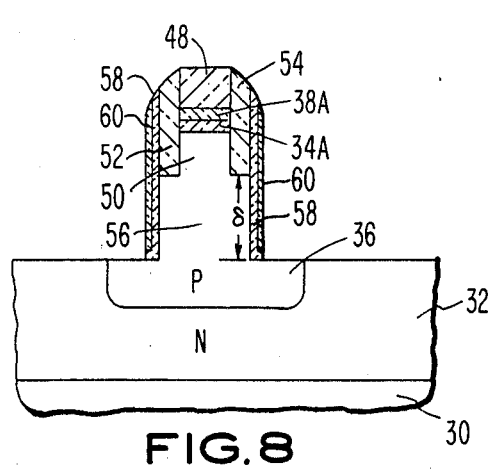

Next, referring to FIG. 8, the RIE is continued to further etch the single crystal silicon material 36 to an additional depth of about 0.4–0.6 $\mu$m forming the middle portion 56 of the protruding P-type single crystal silicon structure having a height $\delta$ and width greater than the width of the top portion 50. The degree to which the present etch step is carried out is governed by the particular application which the final structure would be utilized for. For example, in the case of a bipolar device application, the emitter and collector are formed in the outer surface regions of portion 56 and the dimension $\delta$ would determine the width of the emitter and collector contacts.

It will be appreciated that in each of the preceding and forthcoming etch operations the oxide stud 48 will also be etched. However, since the etch rate ratios of oxide to other mateirals under consideration are rather small (for example, the etch rate ratio of oxide to silicon is approximately 1/10), the stud 48 will not be significantly consumed. In fact, bearing the etch rate ratios in mind one skilled in the art can tailor the stud thickness to serve as an optimum etch mask.

Referring to FIG. 8, the structure is then subjected to a short reoxidation step to grow a thin silicon dioxide layer on the vertical exposed sides of silicon portion 56 followed by CVD of thin oxide 58 and nitride layers over the entire structure. The oxide and nitride so formed are then etched back by RIE leaving a thin nitride layer 60 on oxide 58. In this manner the walls of the newly-created P-type silicon portion 56 are protected by an oxide-nitride mask. As expected, during the preceding oxide-nitride forming steps, this dual dielectric layer will be formed on the thick oxide sidewalls 52 and 54, as well. The CVD oxide deposition step discussed hereinabove is used primarily to augment the thickness of the thermal oxide layer and can be omitted in many cases.

Figure 9:
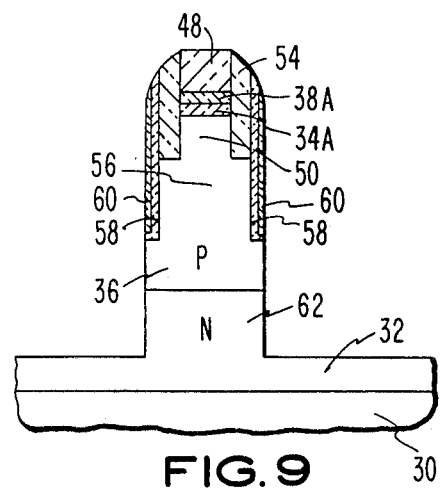

Having protected the vertical walls of silicon 56 in this manner, then, referring to FIG. 8 of the drawings, the RIE is continued to completely etch through the remaining P-type silicon 36 followed by further etching into the N-type silicon thereunder to a sufficient depth (typically, in the range of 0.5–1.5 $\mu$m) forming a structure protruding from the N-type epitaxial silicon body 32 as illustrated in FIG. 9. In this manner the P-type silicon region 36 (see FIG. 4) is fully transformed into a submicron-wide structure towering over an N-type silicon base 62. The upper section of the protruding structure is masked by multilayer dielectric whereas the lower section is exposed as shown in FIG. 9.

A photomasking step is then used to protect the regions of the vertical nitride layers 60—60 corresponding to regions where device contacts contacting the silicon 56 will subsequently be established. The remainder of the nitride layers 60—60 is then removed by an isotropic etching step such as plasma etching. As usual, a very short thermal oxidation step may be used to cover the exposed silicon surfaces prior to the photomasking step.

Figure 10:
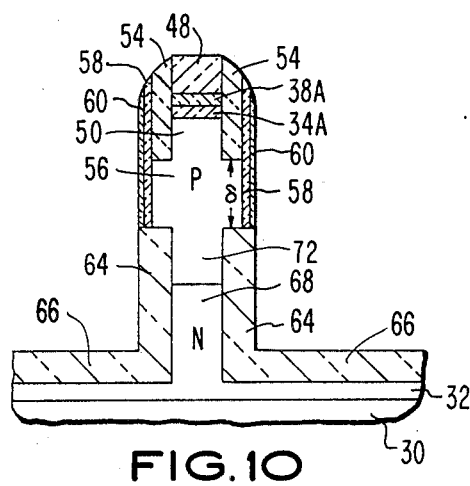

The structure of FIG. 9 is next subjected to a wet etch step to slightly recess (typically, about 0.1–0.2 $\mu$m) the exposed vertical walls of the N- and P-type silicon of the lower section. Then, by thermal oxidation of the structure, thick (about 0.2–0.5 $\mu$m) oxide sidewalls 64 are formed on the exposed sections of silicon while simultaneously also forming the thick oxide layer 66 on the remainder of the N-type epitaxial silicon material 32 as illustrated in FIG. 10. Where the vertical walls of the upper section are covered by the nitride 60, no oxide will be formed on these walls during this oxidation step.

In this manner a single crystal silicon freestanding protrusion structure is formed. The structure is elongated and has a narrow width reaching the submicron limits. Referring to FIG. 10, this structure consists of a narrow lower section 68 of N-type silicon which is flanked by thick oxide sidewalls 64—64. The upper section is made in its entirety of P-type silicon material. It consists of a relatively wide middle portion designated by numeral 56 and narrow top and bottom portions designated by numerals 50 and 72, respectively. The sides of the upper section are covered by multilayers of insulative materials—oxide and nitride. The protrusion structure can be adapted for fabricating therefrom a number of high performance and compact active and passive semiconductor devices. Since the structure is free-standing and protrudes above the remainder of the monolithic silicon body, dielectric isolation thereof is not necessary.

Total dielectric isolation of the silicon protrusion 50-56 can be readily achieved by continuing the thermal oxidation step to grow the oxide sidewalls 64 until the entire silicon corresponding to the lower section 68 and bottom portion 72 is consumed. In other words, thermal oxidation is continued to increase the thickness of oxide sidewalls 64 until complete pinch-off of the silicon regions 68 and 72 takes place. The resulting structure (not shown in FIG. 10) will consist of a single crystal silicon pedestal structure 50-56 which is integral with the silicon substrate 30, but, totally electrically isolated therefrom by a supporting structure of oxide resulting from the coalescence of the two oxide sidewalls 64-64 (FIG. 10) into a single entity. In this case, removal of the nitride 60 from selected regions of the vertical walls is postponed until after partial formation of the oxide in regions 64 and 66. This will facilitate pinching-off of silicon regions 68 and 72 without the corresponding pinching-off of regions 56 and 50.

The specific methods for fabrication of semiconductor devices starting from the structure of FIG. 10 will now be provided.

NPN Transistor

For purposes of forming a lateral NPN transistor the P-type single crystal silicon portion 56 (FIG. 10) is utilized to provide therein the elements of the device. First, the nitride layers 60—60 on the two vertical walls corresponding to the upper section of the protruding structure are removed by a conventional wet etch. The structure that will result consists of basically an oxide protective cover over the entire vertical wall surfaces. To be more specific, referring to FIG. 10, the protruding structure will have sidewalls consisting of thick oxide at the top and bottom separated by a thin oxide. Now, another wet etch step is undertaken to open the contacts in the regions corresponding to the thin oxide sidewall without significantly affecting the thick sidewall oxide at the top and bottom sidewalls.

Figure 11:
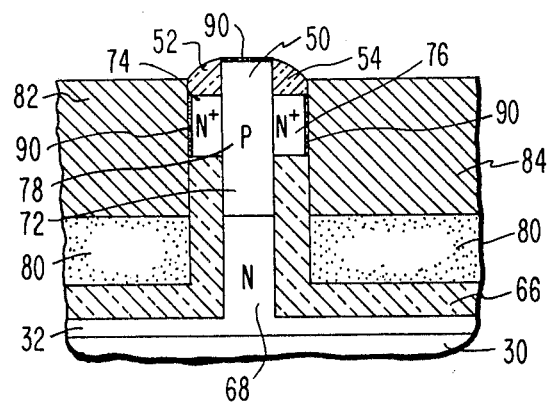
FIG. 11 schematically illustrates in a crosssectional representation a lateral NPN transistor structure fabricated in accordance with the present invention by utilizing the structure of FIG. 10.

Thereafter, by conventional capsule or other dopant diffusion technique such as use of a thin layer of in-situ doped polycrystalline silicon which has been patterned and reactively ion etched to form patches covering the emitter and collector contacts, N-type dopant such as arsenic is introduced from the two exposed sides into the P-type silicon material 56 forming thereby the emitter 74 and collector 76 of the transistor, as illustrated in FIG. 11. The region 78 between the emitter 74 and collector 76 will constitute the base of the NPN device. The emitter 74 and collector 76 will be symmetrically placed with respect to the base 78 and have identical dimensions. More importantly, the N-type dopant diffusion is controlled in such a manner as to form the emitter and collector in a boxed-in relationship with the thick oxide upper and lower sidewalls thereby minimizing any back injection of holes into the emitter. The emitter and collector dimensions in the horizontal and vertical directions are typically in the ranges of 0.2–0.4 $\mu$m and 0.4–0.6 $\mu$m, respectively. The width of the base, i.e., the separation of the emitter 74 from the collector 76 is typically in the range of 0.2–0.4 $\mu$m. Device modeling has demonstrated that the base width could be as large as 0.2 $\mu$m and still obtain an extremely high speed device.

After forming the emitter and collector regions 74 and 76, respectively, the next step of the NPN transistor fabrication process is formation of the base contact. To accomplish this, referring to Fig. 11, first, a planarizing layer of photoresist is deposited over the structure, followed by a photomasking step to expose the top portion of the protrusion structure where the base contact is to be formed. Then, any remaining oxide stud 48 and the underlying nitride 36A and oxide 34A on the top of the protrusion structure are removed thereby exposing the narrow top portion 50 of the base. Next, the photoresist is stripped and a doping step is accomplished using the same dopant species as that used to form the P region 36 (FIG. 4) from which the portion 50 has been carved out, to establish a P-type dopant profile in the portion 50 which enhances the gain of the transistor. In particular, a high dopant concentration of, typically, about $5 \times 10^{18}$ boron atoms/cc at the upper strata and a lower dopant concentration of, typically about $2 \times 10^{16}$ boron atoms/cc at the lower strata of the portion 50 are established. A similar dopant profile inherently is formed in the lower portion 72 of the base due to outward diffusion of the deep implanted P-type species during the course of the various thermal steps associated with the fabrication of this device. In other words, the portion 72 would have a dopant profile of a high concentration at the lower strata and a low dopant concentration at the upper strata thereof, which is a mirror image of the dopant profile of the upper base portion 50.

The dopant profiles established in this fashion in the base portions 50 and 72 give rise to electric fields in these regions which effectively serve not only as barriers to electrons emerging from the emitter 74 during the transistor operation, but also focus these electrons to the direct path between the emitter 74 and the collector 76. In other words, the electrons are prevented from going to either the base contact or the N-type silicon 68. Such a dual action significantly enhances the emitter-collector efficiency thereby increasing the transistor gain.

Figure 13:
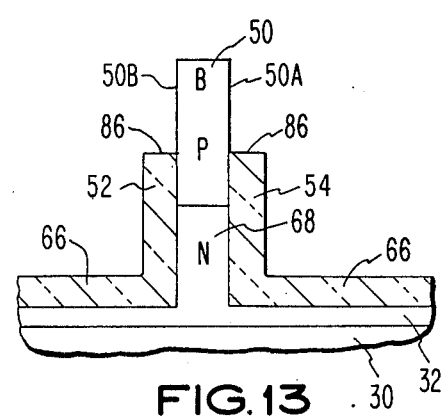
FIGS. 13 and 14 illustrate in cross-sectional representation the rear portion of the transistor structure of FIG. 11 showing, respectively, the base contact opening and the base contact matallurgy.
Figure 12:
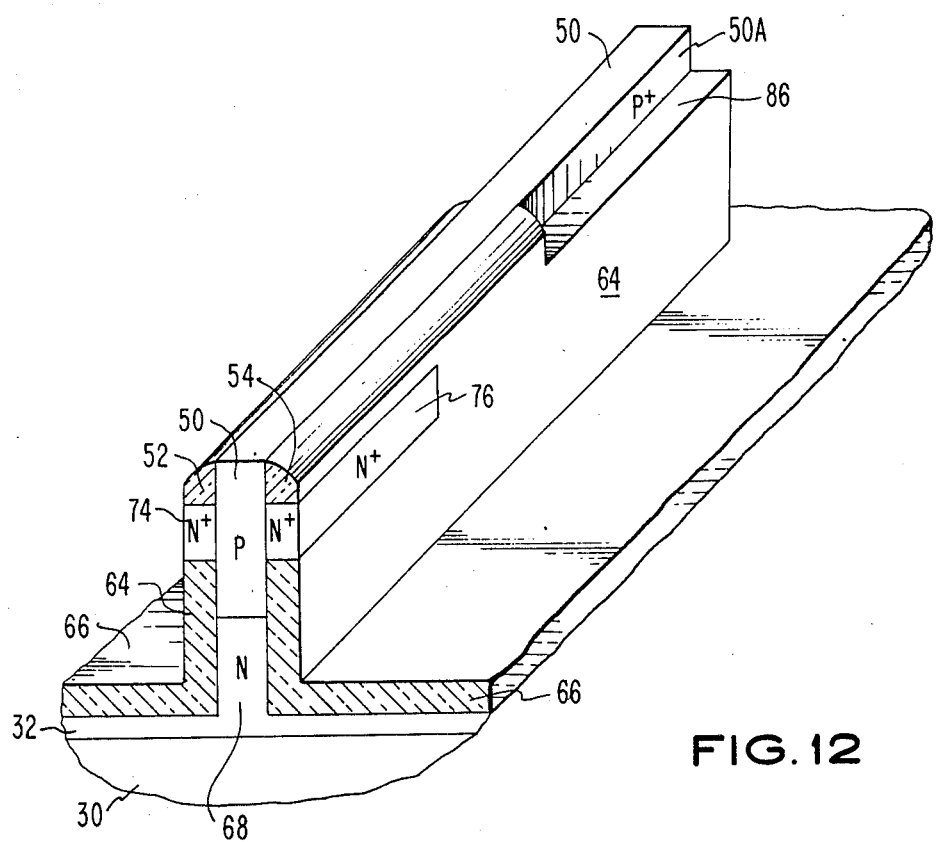
FIG. 12 is a perspective view of the lateral NPN transistor structure illustrating one way of making electrical contact with the base, emitter and collector regions in accordance with the invention.

After providing the field focussing dopant gradients in the base region as indicated above, to continue with the base contact forming process sequence, reference is made to FIGS. 12 and 13 which represent a perspective view and a cross-sectional view, respectively, of the three-dimensional transistor structure after removing the top insulative layers. Using conventional lithographic and etching techniques, base contact opening is formed in the rear portion of the elongated protruding structure as shown in FIG. 12 by first depositing a blanket layer of photoresist over the entire silicon substrate to the level of the top surface of the protrusion. The photoresist is then baked, followed by RIE to expose the entire top surface of the oxide over the P-type silicon 50. Next, the exposed oxide is removed by either wet etch or RIE or a combination thereof, to expose the top surface of the silicon 50. Another photolithography step is used to remove portions of the oxide sidewalls 52 and 54 where the base contact is to be formed. The resulting structure will have a physical step 86 on either side of the protruding structure formed by the exposed vertical wall portions 50A and 50B (designated in FIG. 13, but not in FIG. 12) of the base region 50 and the remaining sidewall oxide 52 and 54 as the case may be. After stripping the photoresist, the exposed portions of the silicon are protected by a thin layer of thermal oxide.

Figure 14:
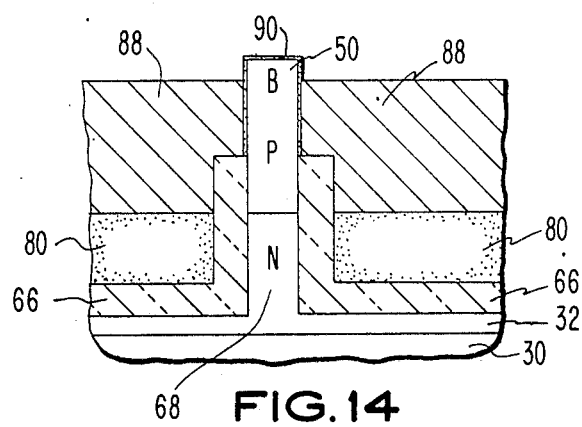

To continue with the fabrication of the NPN transistor, as illustrated in FIGS. 11 and 14, an insulator layer 80, e.g., planarized quartz or polyimide, is formed on the oxide layer 66 to reduce the capacitance of the metal lines that will be subsequently formed over it. Next, metallization contacts self-aligned to the emitter 74, collector 76 and base 50, respectively, are formed by conventional techniques involving such steps as wet etch in buffered HF to open the contacts, sputter deposition of a contact metallurgy such as platinum, and sintering to form platinum silicide (PtSi) layer 90 (FIGS. 11 and 14). Patterned metal lines 82, 84 and 88 contacting the metallization contacts to emitter 74, collector 76 and base 50, respectively, are then formed. Full details of forming the contacts and patterned metal lines 82, 84 and 88 by self-aligned metallurgy process are provided in U.S. Pat. No. 4,400,865 issued to G. R. Goth, I. E. Magdo and S. D. Malaviya and assigned to the present assignee and in articles by the present inventor entitled "Metal Lift-Off Process for Submicron Spacings", IBM Technical Disclosure Bulletin, Vol. 26, No. 3A, pp. 1063–1065, August 1983 and "High Speed Bipolar Process", IBM Technical Disclosure Bulletin, Vol. 27, No. 7B, pp. 4510–4514, December 1984. All of these documents are herein incorporated by reference. Other metallurgies that can be utilized for forming contacts include titanium, tantalum, titanium-tungsten, palladium and molybdenum. If PtSi contact metallurgy is used, the unreacted platinum is removed in aqua regia after sintering. Similarly, if other silicides are used, other suitable etchants are used. The contact metal may be sputtered to a thickness of about 0.05–0.1 μm.

Instead of sputtering the contact metallurgy directly on the contact areas of the single crystal silicon, a thin layer of polysilicon can also be interposed between the single crystal silicon and the contact metal. The resulting polysilicon-silicide (also known as polycide) provides excellent, low resistance contacts to the various elements of the transistor.

The stud-defined NPN transistor formed as indicated above has tight tolerances. Although the lateral dimension of the transistor is lithography defined, the width thereof is not. Consequently, extremely small (well within a micron dimension) devices are feasible. Since smaller the device, the smaller is the parasitic capacitance, performance advantage is immediately realized. Another advantage due to low parasitic capacitance of the transistor is an extremely high cut-off frequency in the range of 12–30 GHz. Since the structure eliminates back injection of charges by effectively boxing-in the emitter, the intrinsic gain of the transistor is significantly high. Another advantage is that a clamped Schottky is not necessary in the collector since the stored charge in the collector-base junction is minimal owing to the small dimensional nature of this junction. Elimination of a clamped diode translates into a higher density for the circuits. Finally, the field focussing capability of the base region practically eliminates loss of electrons emerging from the emitter thereby further improving the transistor gain.

PNP Transistor

To form a stud-defined PNP transistor in accordance with the invention, the basic steps employed in FIGS. 4–14 may be employed by appropriately changing the dopants and adjusting the thermal treatments as required. For example, to form the lateral PNP device, referring to FIG. 4, an N-type diffusion is made into a P-type epitaxial single crystal silicon substrate akin to the manner in which the P-type region 36 was established. This N region may be formed by any of a variety of conventional techniques. After forming the N-type region, the same techniques as employed in FIGS. 4–6 are employed to form an oxide stud for defining the PNP transistor. Likewise, the same techniques as used in FIGS. 7–10 are used to form the protrusion structure having a P-type lower section and an N-type upper section. Then, boxed-in P-type emitter and collector are formed in the upper section analogous their N-type counterparts shown in FIG. 11. Also, N-type dopant is introduced into the base region from the top portion of the base region for providing the field focussing capability discussed hereinabove in connection with the NPN transistor. Contacts to the P-type emitter and collector and N-type base are formed as illustrated in FIGS. 12–14.

Field Effect Transistor

To form an insulated gate field effect transistor (IGFET), the structure illustrated in FIG. 11 will serve as the starting point. The emitter 74 and collector 76 now serve as the source and drain, respectively, of the IGFET and the top surface of the contiguous base region 50–78 will serve as the gate region. This contiguous region is implanted with a P-type dopant, such as boron to obtain the desired IGFET threshold characteristics. For optimal performance of the IGFET, the top surface of silicon 50 can be etched off to a suitable depth thereby reducing the vertical spacing between the gate and source/drain diffusions (74/76, respectively). Ideally, the gate is arranged to be as close to the source/drain diffusions as possible. This etching step will naturally provide a groove in the silicon 50 in which the gate electrode can later be embedded. Then, a gate insulator (e.g., oxide or oxide-nitride) is formed on the exposed top surface of region 50, followed by formation of a gate electrode thereon. Contact matallurgy to the gate can then be formed in a conventional manner.

Junction Field Effect Transistor

To form junction field effect transistor (JFET), at the outset the silicon protrusion is formed from the regions of the semiconductor body 30 (FIG. 4) where the P-type diffusion 36 is not present. In other words, the silicon protrusion structure for forming the JFET will consist of an upper portion of N-type single crystal silicon and a lower portion of P-type silicon formed by etching through the N-type silicon 32 and P-type silicon body 30, respectively, using the various masking and etching steps described hereinabove.

The source and drain regions for the JFET are formed in a manner analogous to the formation of the emitter 74 and collector 76 (FIG. 11) of the bipolar device. Then, any remaining insulating material on the top of the silicon protrusion is removed. P-type dopant (e.g. boron) is introduced into the N-type silicon 50 (not shown in the drawings, but is similar to the P-type silicon 50 of FIG. 11) from the top rendering this top portion of silicon 50 P-type and thereby forming the gate for the IGFET. The P-type dopant is introduced from the top in such a manner that the bottom edge of the P-type layer is in close proximity with the source/drain diffusions. Finally, contacts are established with the source, drain and gate in the same manner as described hereinabove in connection with forming emitter, collector and base contacts for the bipolar device.

Schottky Barrier Diode

Submicron sized high and low barrier high Schottky barrier diodes (SBD) may be fabricated using essentially the same steps as employed to form the bipolar devices. Referring to FIG. 11, the contiguous region 50–78 will now be of the N-type. Region 68 will be of the P-type. The top portion of 50 will correspond to the anode and either the emitter 74 or collector 76 or both together will function as the cathode of the SBD. Suitable additional phosphorous doping may be provided in the anode region to adjust the barrier height of the diode. Again, conventional masking, doping and etching techniques may readily be employed to establish electrical contacts to the anode and cathode of the diode.

This structure can also be conveniently utilized to form a Schottky gate JFET. In this case, an etching step to bring the gate as close to source/drain diffusions as possible is accomplished in the same manner as in the case of IGFET referenced above.

Resistor

To form a submicron-wide resistor element, referring to FIG. 11, without accomplishing the process steps leading to the formation of the emitter and collector, the central P-type silicon region 72-78-50 is utilized. Two metal contacts, each analogous to the manner in which the single base contact of the NPN device is formed, are established at a desired separation along the length of the protrusion structure. Additional boron doping may be incorporated in the region 72-78-50 to adjust the resistor value to a desire sheet resistance.

Alternatively, contacts can be established with the resistor on the width-determining sides of the silicon protrusion structure, instead of at the top, analogous to the emitter and collector contacts for the NPN transistor described hereinabove.

Thus, in summary, there has been provided a novel single crystal silicon semiconductor structure protruding from a silicon body which can be utilized to fabricate therefrom a plethora of active and passive semiconductor integrated circuit devices. This three-dimensional, free-standing structure, which is defined by a submicron-wide stud, has a width corresponding to that of the stud, a length which is dictated by the limits of lithography and a height which is tailored to effectively isolate (in the electrical sense) the device formed at the top thereof from other devices in the semiconductor body. Electrical metallization contacts to the device are also of submicron dimension as necessary and are established on the top and/or the side surfaces of the protruding structure.

The structure fully satisfies the objects and advantages set forth above. Since the device is extremely small and the contacts to the various elements thereof are provided by taking advantage of all three sides of the protruding structure, a significant chip real estate saving is realized thereby rendering the integrated circuit density extremely high. Since the device does not require dielectric isolation, yet further increase in device density is realized. Owing to its small dimensional feature, the parasitic capacitances associated therewith are minimized and performance advantage is gained.

The process of forming the above basic three dimensional silicon structure and the subsequent adaptation of the structure to fabricate individual semiconductor devices is simple, straightforward and requires a significantly fewer number of masking steps compared to prior art processes. To fabricate an NPN device, for example, the present process needs only approximately one-third of the number of masks required by conventional processes. Consequently, a significant fabrication cost saving naturally stems from the invention.

While the invention has been described in conjunction with specific preferred embodiments, it is evident that many alternatives, modifications and variations will be apparent to those skilled in the art in light of the foregoing description. While the integrated circuit structure and the associated fabrication process have been described in the context of silicon technology, other compatible materials like gallium arsenide as well as certain superconducting materials may readily be employed. It is therefore contemplated that the appended claims will embrace any such alternatives, modifications and variations as fall within the true scope and spirit of the invention.

I claim:

1. A method for forming a narrow dimensioned semiconductor protrusion structure protruding from and integral with a semiconductor body, said method comprising:
   providing a semiconductor body of a first conductivity type having a surface region of a second conductivity type;
   forming a narrow dimensioned insulator stud having substantially vertical outer walls on said surface region;
   anisotropically etching said body using said stud as a mask forming a narrow dimensioned top portion of said protrusion structure, said top portion having substantially vertical walls of said semiconductor material;
   forming a first insulating layer on said walls of the stud and the walls of said top portion to obtain a first resulting structure;
   anisotropically etching said body using said first resulting structure as a mask forming a relatively wide dimensioned middle portion of said protrusion structure, said middle portion having substantially vertical walls of said semiconductor material;
   forming a second insulating layer on the walls of said first resulting structure and the walls of said middle portion to obtain a second resulting structure; and
   anisotropically etching said body using said second resulting structure as a mask to completely etch through said surface region and a portion of said body thereunder forming a lower section of said protrusion structure, said lower section having substantially vertical walls of said semiconductor material,
   whereby is formed a free-standing and substantially vertical-walled semiconductor protrusion structure integral with said semiconductor body.

2. The method as recited in claim 1 wherein said insulator stud forming step comprises:
   forming a third insulating layer on said body;
   providing a thermally oxidizable mask having a vertical edge on said third insulating layer leaving a portion of said third insulating layer exposed, said edge corresponding to approximately the center of said surface region;
   thermally oxidizing to grow an oxide wall on said edge;
   removing by anisotropic etching said mask leaving an oxide stud on said third insulating layer; and
   anisotropically etching said exposed third insulating layer to form an insulator stud centered on said surface region, said stud consisting of a top zone of oxide and a bottom zone of said third insulating layer.

3. The method as recited in claim 1 further comprising forming a fourth insulating layer on the exposed walls of the lower section of said protrusion structure.

4. The method as recited in claim 2 wherein said semiconductor body is silicon.

5. The method as recited in claim 3 wherein said fourth insulating layer is silicon dioxide.

6. The method as recited in claim 5 wherein said semiconductor body is silicon and said fourth insulating layer forming step comprises thermally oxidizing said exposed walls of the lower section.

7. The method as recited in claim 6 further comprising completely converting said lower silicon section by thermal oxidation into silicon dioxide whereby said protrusion structure is total dielectrically isolated from said semiconductor body.

8. The method as recited in claim 7 further comprising forming at least one semiconductor device in said total dielectrically isolated silicon protrusion structure.

9. The method as recited in claim 8 wherein said device is a bipolar transistor.

10. The method as recited in claim 8 wherein said device is a field effect transistor.

11. Method for forming submicron-wide dielectrically isolated semiconductor protrusion structure comprising:
providing a monocrystalline silicon body of a first conductivity type having a surface region of a second conductivity type;
providing a first insulating layer on the surface of said body;
forming a submicron-wide sidewall stud having substantially vertical outer walls on said first insulating layer directly above said surface region;
anisotropically etching through said first insulating layer and into said body using said stud as a mask to a first depth forming a top portion of said protrusion structure, said top portion having substantially vertical walls;
forming a second insulating layer on said walls of said stud and top portion of said protrusion structure forming a first resulting structure;
anisotropically etching said body using said first resulting structure as a mask to a second depth forming a relatively wide middle portion of the protrusion structure, said middle portion having substantially vertical walls;
forming a third insulating layer on the walls of said first resulting structure and of said middle portion to obtain a second resulting structure;
anisotropically etching said body using said second resulting structure as a mask to a third depth to completely etch through said surface region and a portion of the body thereunder forming a lower section of said protruding structure, said lower section having substantially vertical walls; and
forming a fourth insulating layer on said walls of the lower section,
whereby is formed a free-standing, substantially vertical-walled and electrically isolated monocrystalline silicon protrusion structure integral with said silicon body.

12. The method as recited in claim 11 wherein said fourth insulating layer is a relatively thick silicon dioxide.

13. The method as recited in claim 11 further comprising thermally oxidizing said substantially vertical sides to completely covert the lower section of said silicon protrusion structure into silicon dioxide whereby is formed a monocrystalline silicon protrusion structure integral with and total dielectrically isolated from said silicon body.

14. The method as recited in claim 12 wherein said second insulating layer is silicon dioxide.

15. The method as recited in claim 14 wherein said third insulating layer is a dual layer of silicon dioxide-silicon nitride, formed in the order specified.

16. The method as recited in claim 15 further including forming a bipolar transistor device within said protrusion structure, comprising:
forming openings in the oxide-nitride dual layer formed on both sides the middle portion of said protrusion structure to expose the silicon in correspondence therewith;
introducing dopant of said first conductivity type through said openings into the walls of said middle portion forming an emitter and collector juxtaposed in either side of a central region of said middle portion, said central region serving as the base of said transistor; and
making electrical contact to at least said emitter and collector along said sides of the middle portion.

17. The method as recited in claim 15 further including forming Schottky diode within said protrusion structure, comprising:
forming an opening in the oxide-nitride dual layer formed on at least one side of the middle portion of said protrusion structure to expose the silicon in correspondence therewith;
introducing dopant of said second conductivity type through said opening into the walls of said middle portion forming the cathode of said diode, the remainder of said middle portion and said top portion serving as the anode of said diode;
making an opening in the insulator on said top portion to expose a surface part of said top portion; and
making electrical contacts to said cathode and anode.

18. The method as in claim 15 further comprising:
forming openings in the dual oxide-nitride layers on both sides of said middle portion of the protrusion structure to expose the silicon in correspondence therewith;
introducing dopant of said first conductivity type through said openings into the walls of said middle portion forming a pair of cathodes, the remainder of said middle portion and said top portion of the protrusion serving as the anode; and
making electrical contacts to said cathode on both sides of said protrusion structure.

19. The method as recited in claim 15 further including forming a resistor within said protrusion structure, comprising:
making openings at a predetermined separation in the insulator on the top portion of said protrusion structure to expose the corresponding surface parts of said top portion; and
making electrical contacts to said top portion through said exposed surface parts.

20. The method as recited in claim 15 further including forming a resistor within said protrusion structure, comprising:
making openings in said oxide-nitride insulator formed on the sides of the middle portion of said protrusion to expose the silicon in correspondence therewith; and
making electrical contacts to silicon exposed in the previous step.

21. The method as recited in claim 16 further comprising:
forming a base contact opening in the insulator on said top portion of the protrusion structure; and
making electrical contact to said base through said base contact opening.

22. The method as recited in claim 16 further including forming an insulated gate field effect transistor within said protrusion structure, comprising:
forming openings in the oxide-nitride dual layer formed on the sides of the middle portion of said protrusion to expose the silicon in correspondence therewith;

introducing dopant of said first conductivity type through said openings into the walls of said middle portion forming a source and drain juxtaposed on either side of a central region of said middle portion, said central region serving as the gate region of said field effect transistor;

making an opening in the insulating layer on said top portion to expose a part of said top portion;

forming a relatively thin silicon dioxide gate insulator on said exposed top portion;

forming gate electrode overlying said gate insulator in correspondence with said gate region; and making electrical contact to said source and drain.

23. The method as recited in claim 16 further including forming a junction field effect transistor within said protrusion, comprising:

forming openings in said oxide-nitride dual layer formed on the side of the middle portion of said protrusion to expose the silicon in correspondence therewith;

introducing dopant of said first conductivity type through said openings into the walls of said middle portion, forming a source and drain juxtaposed on either side of a central region of said middle portion, said central region serving as the gate region of said transistor;

making an opening in the insulator layer on said top portion to expose a surface part of said top portion;

introducing dopant of said first conductivity type through said opening in the top insulator layer into said central region forming a conducting channel between said source and drain;

introducing dopant of said second conductivity type into a surface region of said top portion through the opening formed in the previous step;

forming a gate electrode in said opening in the insulator layer on said top portion; and making electrical contacts to said source and drain.

24. The method as recited in claim 19 further comprising introducing dopant of said second conductivity type into the surface region of said top portion prior to making said electrical contacts to said top portion.

25. Method for forming dielectrically isolated semiconductor bipolar transistor device protruding from a semiconductor body, said method comprising:

providing a monocrystalline silicon body of a first conductivity type;

forming a base region of a second conductivity type in said body;

providing a first insulating layer on the surface of said body containing said base region;

forming an insulating sidewall stud having substantially vertical outer walls on said first insulating layer directly above said base region;

anisotropically etching through said first insulating layer and into said body using said stud as a mask to a first depth forming the top portion of a silicon protrusion structure protruding from said body, said top portion having substantially vertical walls;

forming a second insulating layer on said walls of said stud and top portion forming a first resulting structure;

anistropically etching through said body using said first resulting structure as a mask to a second depth forming the middle portion of the silicon protrusion structure, said middle portion having substantially vertical walls;

forming a third insulating layer on said walls of said first resulting structure and said middle portion to obtain a second resulting structure;

anisotropically etching through said body using said second resulting structure as a mask to a third depth to completely etch through said base region and a portion of the body thereunder forming a lower section of the silicon protrusion structure, said lower section having substantially vertical walls;

forming a fourth insulating layer on said walls of said lower section to provide dielectric isolation for said protrusion structure;

forming openings in the third insulating layer on side walls of said middle portion to expose the silicon in correspondence therewith;

introducing dopant of said first conductivity type through said openings into the walls of said middle portion forming the emitter and collector of said transistor, said emitter and collector being juxtaposed on either side of a central region of said middle portion, said central section serving as the base of said transistor; and establishing electrical contacts to at least said emitter and collector along said walls of the middle portion.

26. The method as recited in claim 25 said fourth insulator forming step comprises thermally oxidizing said lower section to grow a relatively thick layer of silicon dioxide.

27. The method as recited in claim 26 further comprising continuing said thermal oxidation step to completely convert said lower portion of silicon into silicon dioxide, thereby forming total dielectric isolation of said transistor from said body.

* * * * *